United States Patent [19]
Barsan et al.

[11] Patent Number: 5,942,780
[45] Date of Patent: Aug. 24, 1999

[54] INTEGRATED CIRCUIT HAVING, AND PROCESS PROVIDING, DIFFERENT OXIDE LAYER THICKNESSES ON A SUBSTRATE

[75] Inventors: Radu M. Barsan, Cupertino; Xiao-Yu Li; Sunil Mehta, both of San Jose, all of Calif.

[73] Assignee: Advanced Micro Devices, Inc., Sunnyvale, Calif.

[21] Appl. No.: 08/689,523

[22] Filed: Aug. 9, 1996

[51] Int. Cl.⁶ ................................................. H01L 29/788
[52] U.S. Cl. .................... 257/321; 257/314; 257/315; 257/316; 257/318; 438/259; 438/264; 365/185.1
[58] Field of Search .................... 257/314, 315, 257/316, 318, 321; 438/258, 259, 264; 365/185.1, 185.04

[56] References Cited

U.S. PATENT DOCUMENTS

| | | | |
|---|---|---|---|
| 4,651,406 | 3/1987 | Shimizu et al. | 29/571 |
| 4,716,126 | 12/1987 | Cogan | 437/24 |
| 4,807,003 | 2/1989 | Mohammadi et al. | 257/318 |
| 4,924,278 | 5/1990 | Logie | 357/23.5 |
| 5,308,787 | 5/1994 | Hong et al. | 437/70 |
| 5,330,920 | 7/1994 | Soleimani et al. | 437/24 |
| 5,432,114 | 7/1995 | O | 437/56 |
| 5,532,181 | 7/1996 | Takebuchi et al. | 437/43 |
| 5,587,945 | 12/1996 | Lin et al. | 365/185.1 |
| 5,633,520 | 5/1997 | Wu et al. | 257/315 |

OTHER PUBLICATIONS

"Simultaneous Growth of Different Thickness Gate Oxides in Silicon CMOS Processing", Brian Doyle, IEEE Electron Device Letters, vol. 16, No. 7, Jul. 1995, pp. 301–303.

*Primary Examiner*—Valencia Martin-Wallace
*Attorney, Agent, or Firm*—Fliesler, Dubb, Meyer & Lovejoy LLP

[57] ABSTRACT

An integrated circuit ("IC") having three different oxide layer thicknesses and a process for manufacturing the IC using a single oxide growth step is provided. A first region is formed on a substrate surface with oxidation enhancing properties. A second region is formed on the substrate surface with a dose of nitrogen that retards oxidation. An oxide layer is grown from the first and the second regions and a third region of the substrate such that the first, second, and third regions yield a first oxide layer for the capacitor, a second oxide layer for the read transistor and a third oxide layer for the write transistor.

6 Claims, 14 Drawing Sheets

INTEGRATED CIRCUIT HAVING, AND PROCESS PROVIDING, DIFFERENT OXIDE LAYER THICKNESSES ON A SUBSTRATE

BACKGROUND

1. Field of the Invention

The present invention relates generally to an integrated circuit ("IC"). The invention relates more specifically to an IC having, and a process for providing, an oxide layer of plural thicknesses on a substrate.

2a. Cross Reference to Related Applications

The following copending U.S. patent application is assigned to the assignee of the present application, is related to the present application and its disclosure is incorporated herein by reference:

(A) Ser. No. 08/561,306 [Attorney Docket No. AMDI8125MCF/GGG/PHH] by Barsan, et al and entitled MULTIPLE GATE OXIDE THICKNESSES ON A WAFER SUBSTRATE.

2b. Cross Reference to Related Patents

The following U.S. patent is assigned to the assignee of the present application, is related to the present application and its disclosure is incorporated herein by reference:

(A) U.S. Pat. No. 4,924,278 issued May 8, 1990, to Logie and entitled EEPROM USING A MERGED SOURCE AND CONTROL GATE.

3. Description of the Related Art

IC devices, such as Electrically Erasable and Reprogrammable Read-Only Memory ("EEPROM") devices and Programmable Logic Devices ("PLD"s), commonly contain transistors and other circuit elements that operate at different voltage levels or switching speeds. A single IC device may include plural transistors respectively operating at high and low voltages. A non-volatile memory cell such as disclosed in U.S. Pat. No. 4,924,278 referenced above, for example, may include a first transistor that operates at a relatively high drain-to-source voltage level, for example 12 volts, for program and erase operations as well as a second transistor that operates at a relatively low drain-to-source voltage level, for example 3.3 volts, for read operations. High voltage transistors are usually integrally formed with a relatively thick gate oxide layer ("GOX"). The relatively thick gate oxide helps to prevent transistor breakdown in a high voltage operating environment. However, it is preferable that a read transistor is formed with relatively thin gate oxide. Thin gate oxide helps to increase the switching speed of the transistor by increasing saturation current $I_{dsat}$ in short channel length designs. Transistor elements having relatively short gate lengths and thin oxide layers generally provide increases in operating speeds.

As process technologies evolve toward shorter gate lengths, it is desirable to reduce the thickness of a gate oxide layer in logic transistors even further in order to achieve greater operating speed. However, some circuit elements contained on an IC device may not be scalable in this manner.

For example, the memory cell described in U.S. Pat. No. 4,924,278 referenced above, commonly comprises a tunnel capacitor that includes a tunnel oxide ("TOX") layer. To have an operative tunneling effect, the TOX should be in a certain range of thicknesses. This is dictated by electron physics. As such, tunnel oxide thickness cannot be scaled down in the same manner as a low voltage GOX. This tunnel capacitor may suffer from significant endurance and data retention problems if the tunnel oxide layer is made too thin. Tunneling may be substantially impaired if it is made too thick.

It may be desirable to have a non-volatile memory cell formed with at least three different thicknesses of gate oxide ("GOX"). Write transistors should have a relatively large first thickness of gate oxide ("HVGOX") to accommodate high voltage program and erase operations. Read transistors should have relatively smaller, second thickness of gate oxide ("LVGOX") to yield faster switching speed at lower voltages. Tunnel capacitors may call for an independently set, third thickness of gate oxide ("TOX").

One method of forming differing oxide layer thicknesses on the same substrate involves the following multiple mask and oxide formation steps: (1) A first oxide sublayer is initially grown on a wafer substrate. (2) Thereafter, parts of the first oxide sublayer are usually masked with a photoresist mask layer and remaining unmasked oxide is stripped or etched away from the wafer substrate. (3) Thereafter, the photoresist mask layer is typically stripped away. (4) A second oxide sublayer is grown, adding to the thickness of the first oxide sublayer. Thicker oxide is produced where the first oxide sublayer resided and thinner oxide is produced where the first oxide had been earlier removed.

Unfortunately, the photoresist mask layer used to mask the first oxide sublayer usually leaves residue on the surface of the first oxide sublayer after removal. Photoresist residue on the first oxide sublayer typically reduces the overall quality of the subsequent thicker oxide that is thermally grown thereafter. Moreover, this method requires the performance of multiple photoresist mask layer and oxide layer formation steps in a manufacturing process. These extra steps typically increase the overall costs of a manufacturing process and degrade reliability as well as yield.

In another method: (1) A first oxide layer is initially grown on a wafer surface. (2) Next, a portion of the first oxide layer is masked with a photoresist mask layer. (3) The remaining unmasked oxide is then etched back to form a thinner oxide layer. Unfortunately, the last etching step to form the thinner oxide is usually difficult to control and hinders the precision with which oxide layers are formed.

Various patents and articles have described the use of nitrogen in forming oxide layers. U.S. Pat. No. 5,308,787, Hong, et al., entitled "Uniform Field Oxidation for Locos Isolation", dated May 3, 1994 ("Hong"), describes the use of nitrogen in hindering oxide formation to form a two-thickness layer.

Likewise, "Simultaneous Growth of Different Thickness Gate Oxides in Silicon CMOS Processing" by Brian Doyle, Member, IEEE, Hamid R. Soleimani and Ara Philipossian, as published in IEEE Electron Device Letters, Vol. 16, No. 7, July 1995 ("Doyle"), describes using nitrogen to retard or reduce oxide growth in forming various oxide layers.

It is desirable to provide an integrated circuit device, such as a non-volatile memory cell, having at least three different, precisely controlled thicknesses of GOX.

Further, it is desirable to provide a process for manufacturing the above circuit in a reliable and cost-effective manner without multiple mask and oxidation formation process steps.

SUMMARY OF THE INVENTION

The invention overcomes the above-mentioned problems by providing an integrated circuit having at least three different oxide layer thicknesses. A process for manufacturing the integrated circuit uses different concentrations of nitrogen implant and dopant implant to form surface areas having oxidation retarding properties and oxidation enhancement properties, respectively. In one embodiment, a single thermal oxidation step forms three different GOX thicknesses of the integrated circuit.

According to one aspect of the present invention, an integrated circuit in accordance with the present invention comprises: (a) a substrate; (b) an oxide layer where the oxide layer includes a first oxide thickness, a second oxide thickness different from the first by $\Delta_1$ and a third oxide thickness different from the second by $\Delta_2$.

In accordance with another aspect of the present invention, a non-volatile memory cell on and below a silicon wafer substrate surface in accordance with the present invention comprises: (a) a first field effect transistor having a drain, a source, a channel, and a gate, the gate being separated from the channel by a gate oxide layer having a first thickness; (b) a second field effect transistor having a drain, a source, a channel and control gate, the gate being separated from the channel by a gate oxide layer having a second thickness; and, (c) a tunnel capacitor having a tunnel oxide layer having a third thickness.

According to another aspect of the present invention, an EEPROM in accordance with the present invention comprises: (a) a semiconductor substrate of a first conductivity type having a top surface; (b) a first source region of a conductivity type opposite that of said substrate formed on and below said surface of said substrate; (c) a first drain region of a conductivity type opposite that of said substrate formed on and below said surface of said substrate; d) a first control gate coupled to a first channel region by a gate oxide having a first thickness, said first source region, first drain region, first channel region, and first control gate forming a write transistor; (e) a second source region of a conductivity type opposite that of said substrate formed on and below said surface of said substrate; (f) a second drain region of a conductivity type opposite that of said substrate formed on and below said surface of said substrate; (g) a second channel region between said second source region and said second drain region; (h) a gate oxide layer having a second thickness formed over said second channel region and said second source region; (i) a tunnel oxide layer having a third thickness; (j) a floating gate formed over and insulated from said second channel region, said second source region and said first source region, said floating gate being capacitively coupled to said second source region via said gate oxide layer and capacitively coupled to said first source region of said write transistor via said tunnel oxide layer of the third thickness to allow electron tunneling upon incurrence of a sufficient voltage potential between said floating gate and said first source region of said write transistor, said second source region, second drain region, second channel region, said gate oxide layer and said floating gate forming a sense transistor; (k) a third source region of a conductivity type opposite that of said substrate formed on and below said surface of said substrate, said third source region also acting as said second drain region of said sense transistor; (l) a third drain region of a conductivity type opposite that of said substrate formed on and below said surface of said substrate; (m) a third channel region between said third source region and said third drain region; and (n) a third control gate electrically coupled to a third channel region by a gate oxide having a fourth thickness, said third source region, said third drain, said third channel region, and said third control gate forming a read transistor.

According to another aspect of the present invention, a process for manufacturing an integrated circuit comprising the steps of: (a) forming a first region on and below a substrate surface wherein the first region contains a dopant that enhances oxide formation on the first region; (b) implanting a first dose of nitrogen into the first region and into a second region on and below the substrate such that the dose of nitrogen retards oxide formation on the first region and the second region; (c) implanting a second dose of nitrogen into the second region; (d) forming an oxide layer over the first region, the second region and a third region of the substrate wherein the oxide layer includes a first oxide layer having a first thickness for a first circuit element, a second oxide layer having a second thickness for a second circuit element and a third oxide layer having a third thickness for a third circuit element.

According to another aspect of the present invention, a process for manufacturing an integrated circuit comprising the steps of: (a) forming a first region on and below a substrate surface wherein the first region enhances oxide formation; (b) forming a second region on and below the substrate surface wherein the second region enhances oxide formation; (c) implanting a dose of nitrogen into the first region and second region which retards oxide formation; and (d) forming an oxide layer on and below the first region, the second region, and a third region of the substrate wherein the oxide layer includes a first oxide layer having a first thickness for a first circuit element, a second oxide layer having a second thickness for a second circuit element and a third oxide layer having a third thickness for a third circuit element.

According to another aspect of the present invention, a process for manufacturing an integrated circuit comprising the steps of: (a) forming a first region on and below a substrate surface wherein the first region contains a dopant that enhances oxide formation on the first region; (b) forming a first oxide layer on the substrate; (c) implanting a dose of nitrogen into a second region on and below the substrate surface through the first oxide layer such that the dose of nitrogen retards oxide formation on the second region; (d) removing the first oxide layer over the first and the second regions; (e) forming a second oxide layer over the first and the second regions and over a third region of the substrate, wherein the second oxide layer has a first thickness for a first circuit element over the first region, a second thickness for a second circuit element over the second region, and the first oxide layer and second oxide layer combine to form a third thickness for a third circuit element.

Other aspects and advantages of the present invention can be seen upon review of the figures, the detailed description and the claims which follow.

BRIEF DESCRIPTION OF THE DRAWINGS

The below detailed description makes reference to the accompanying drawings, in which.

DETAILED DESCRIPTION

1. Memory Cell Structure

Figure 1A:
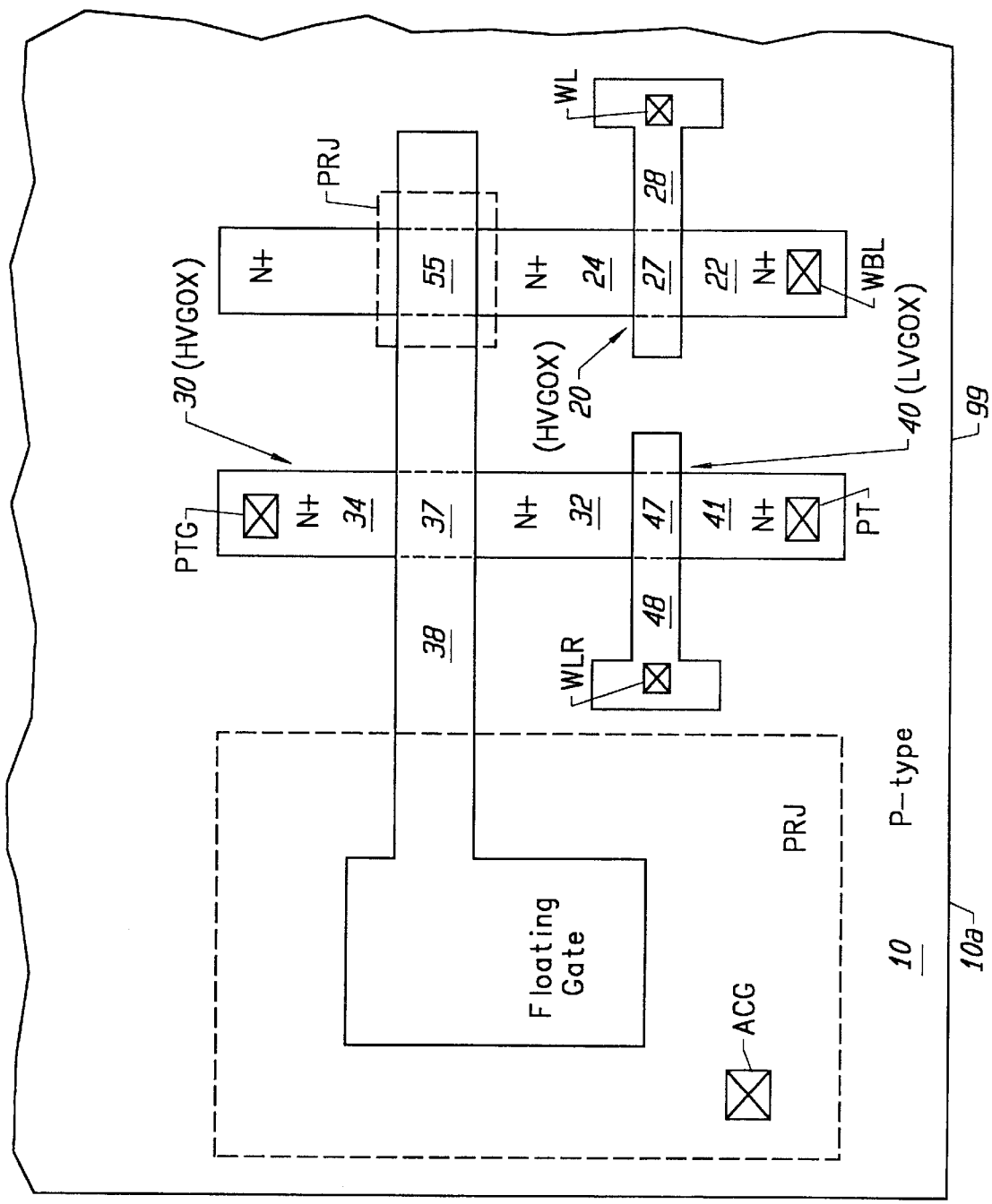
FIGS. 1a–1e illustrate a non-volatile memory cell that uses multiple gate oxide thicknesses and may be produced in accordance with the present invention.

FIG. 1a illustrates an integrated circuit and, in particular, an Electrically Erasable Reprogrammable Read-Only Memory ("EEPROM") cell structure 99 that may be formed in accordance with an embodiment of the present invention.

Figure 1B:
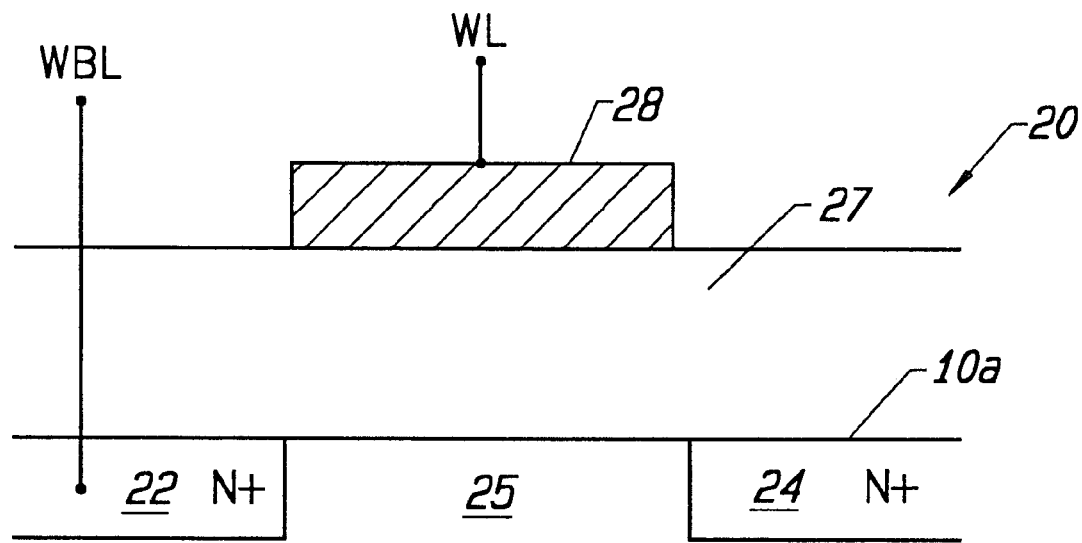

In FIG. 1a, a p-type substrate 10 has N+ type regions formed on and below the surface 10a of the substrate. These N+ regions correspond to the source and drain regions of three transistors 20, 30, 40 which make up EEPROM memory cell 99. FIGS. 1a and 1b illustrate write transistor 20 having drain 22, source 24, channel region 25, gate oxide region 27 and gate 28. Metal contact WL is coupled to gate 28. Likewise, metal contact WBL is coupled to drain 22.

Figure 1C:
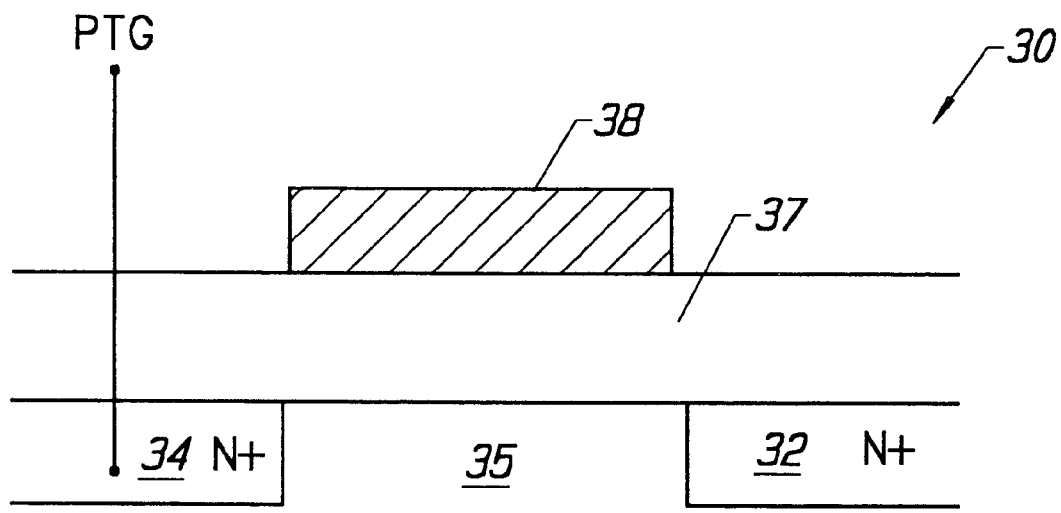

FIGS. 1a and 1c illustrate sense transistor 30 having drain 32, source 34, channel region 35, gate oxide region 37, and N-type polycrystalline ("poly") floating gate 38. Metal contact PTG is also coupled to source 34. Floating gate 38 is capacitively coupled to source 24 of write transistor 20 via tunnel oxide region 55 shown in FIGS. 1a and 1e.

Figure 1D:
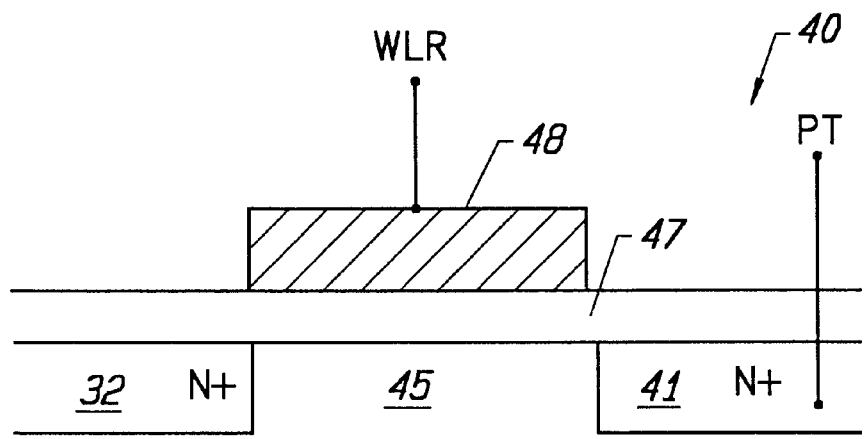

FIGS. 1a and 1d illustrate read transistor 40 having drain 41 and source 32. Region 32 is also the drain of sense transistor 30. Read transistor 40 further comprises channel region 45, gate oxide region 47, and gate 48. Metal contact WLR is coupled to gate 48 and metal contact PT is coupled to drain 41.

Figure 1E:
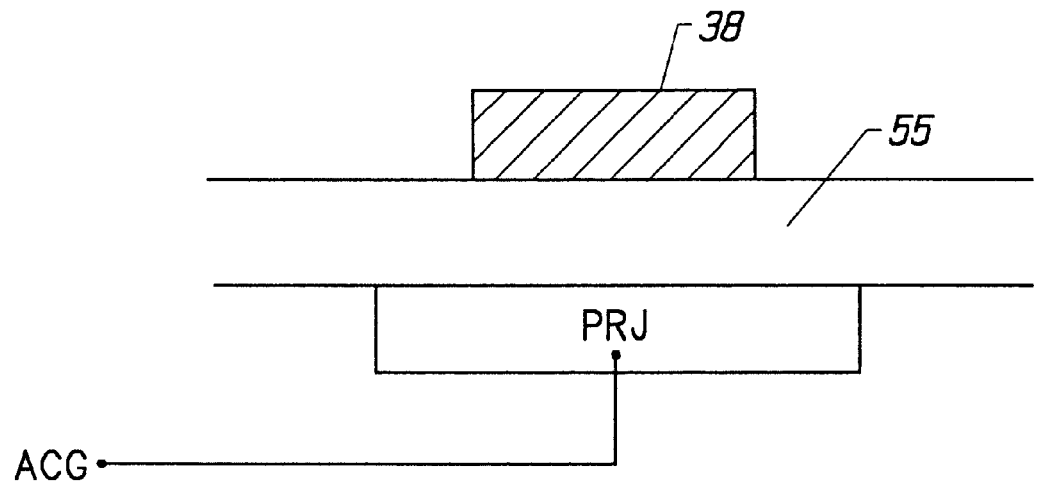

FIG. 1e illustrates a tunnel capacitor having floating gate 38, tunnel oxide region 55 and PRJ region coupled to metal contact ACG.

Table 1 illustrates possible thicknesses that might be used for the oxide region 27 of write transistor 20, for read transistor oxide region 47, for tunnel oxide region 55, and for corresponding transistor channel lengths. A manufacturing process according to the present invention for repeatedly and accurately providing these gate oxide thicknesses is described in detail below.

TABLE 1

| Technology Name | Write Transistor Gate Oxide Thickness 27 | Read Transistor Gate Oxide Thickness 47 | Tunnel Oxide Thickness 55 | Channel Length |
|---|---|---|---|---|
| A | 150Å | 150Å | 90Å | .7μ |
| B | 150Å | 80Å | 90Å | .5μ |
| C | 150Å | 70Å | 90Å | .35μ |
| D | 150Å | 50Å | 90Å | .25μ |

2. Memory Cell Operation

Figure 2:
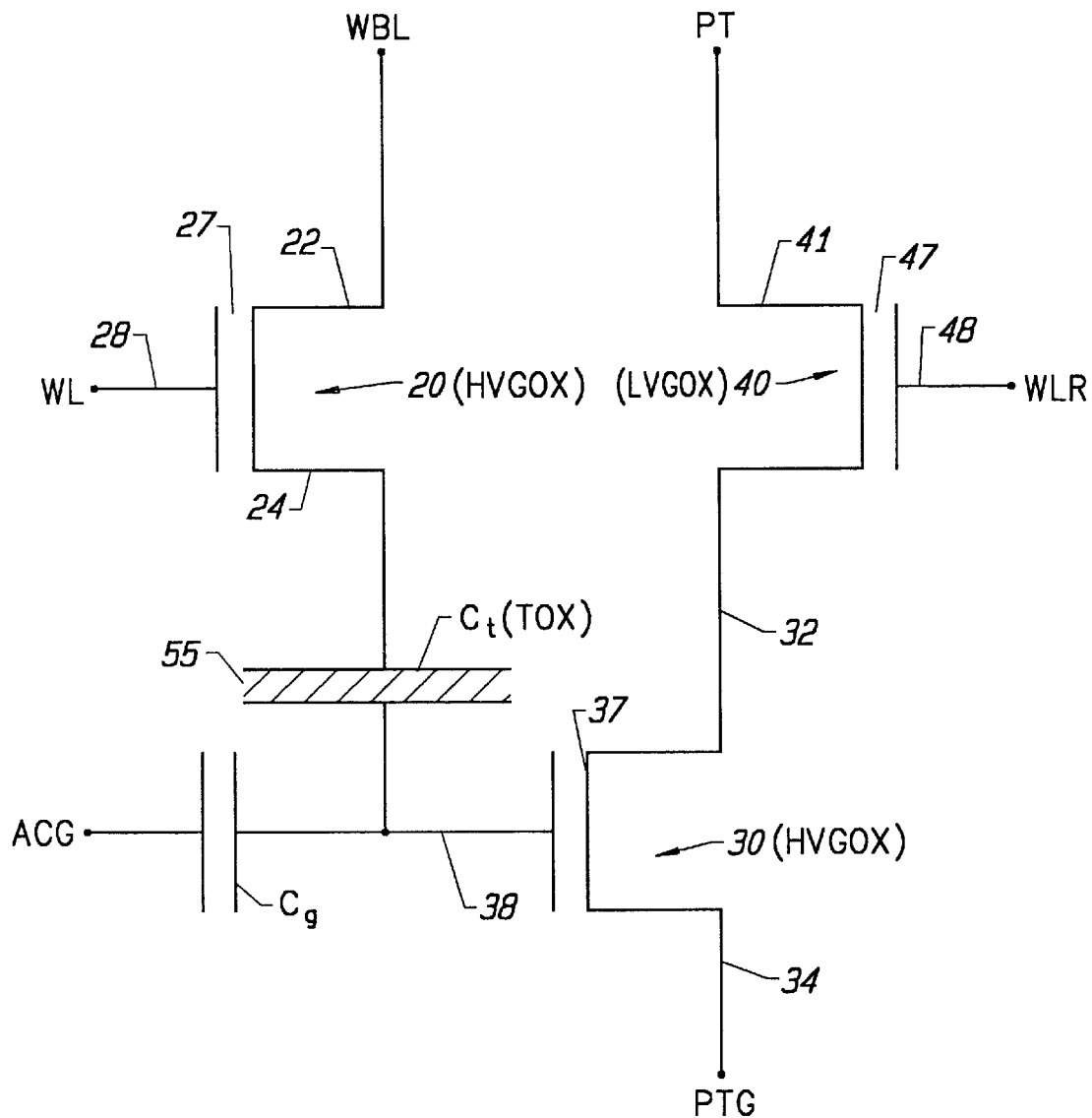
FIG. 2 is a schematic circuit diagram of the nonvolatile memory cell of FIG. 1.

Operation of memory cell 99 will be described with reference to FIGS. 1a–e and 2. FIG. 2 is a circuit schematic of memory cell 99 shown in FIGS. 1a–e. Capacitor $C_t$ represents the capacitance associated with tunnel oxide layer 55, while capacitor $C_g$ represents capacitance associated with floating gate 38.

The three operations of memory cell 99 are program (also known as write), erase and read. The various voltages applied to the circuit illustrated in FIG. 2 are shown in Table 2.

TABLE 2

| | WLR | WL | WBL | PT | PTG | Substrate | ACG |
|---|---|---|---|---|---|---|---|
| Read | $V_{cc}$ | $V_{cc}$ | ground | $V_{sense}$ | ground | ground | ground |
| Program | ground | $V_{pp}$ + $V_t$ | $V_{pp}$ | Floating | ground | ground | ground |
| Erase | $V_{cc}$ | $V_{cc}$ | ground | Floating | $V_{pp}$ | ground | $V_{pp}$ + $V_t$ |

When floating gate 38 is to be "programmed", electrons are drawn away from floating gate 38. To accomplish this, first, a relatively high, positive programming voltage $V_{pp}$+ (13.5 volts)=$V_{pp}$(11.5 volts)+$V_t$(2 volts) (typically, 11–12 volts) is applied to metal contact WL and $V_{pp}$ is applied to metal contact WBL. This turns on write transistor 20 and couples $V_{pp}$ to the source 24 of transistor 20. Metal contact ACG is grounded. Electrons from the floating gate flow through tunnel oxide region 55 towards the positive ($V_{pp}$) source 24, resulting in a net positive charge on floating gate 38. The positive charge should be sufficient to turn on sense transistor 30 during a read operation.

To erase floating gate 38, high programming voltage $V_{pp}$+$V_t$ is applied to metal contact ACG. Substrate 10 and metal contact WBL are grounded. Metal contact PTG has $V_{pp}$ applied and metal contact PT is allowed to float. $V_{cc}$ is applied to metal contact WLR and WL. This causes electrons from source 24 to tunnel through tunnel oxide region 55, resulting in a net negative charge on floating gate 38. Thus, channel 35 of sense transistor 30 is not inverted and sense transistor 30 is shut off.

When reading the state of sense transistor 30, operating voltage $V_{cc}$ (typically 3.3 volts), which is less than programming voltage $V_{pp}$, is applied to metal contact WLR, and voltage $V_{sense}$(typically 0.7–1.4V) is applied to drain 41 of read transistor 40. Drain 22 of write transistor 20, as well as source 34 of sense transistor 30 and substrate 10, are grounded. A current flows between drain 41 and source 34 if sense transistor 40 is on, indicating a logical 1. If sense transistor 30 is off, current does not flow, indicating a logical 0.

Since read transistor 40 is not subject to high voltage $V_{pp}$ between their source and drain regions or across gates, channel length may be shortened to increase reading speed.

During the erase operation, source 34 and drain 32 of sense transistor 30 are at a high voltage while substrate 10 is grounded. This drives channel 35 into deep depletion, thus reducing the undesired parasitic capacitance between floating gate 38 and channel 35 and, hence, creating a higher coupling ratio during the erase operation, enabling faster erase times. During the writing (programming) operation, both source 34 and channel region 35 are grounded so no undesired parasitic capacitances exist.

3. Process for Manufacturing an Integrated Circuit having Different Oxide Layer Thicknesses FIGS. 3a–3d show cross-sections of a substrate during various steps in the manufacturing of an IC using nitrogen implant in accordance with the present invention. FIGS. 4a–4d show cross-sections of a substrate during various steps in manufacturing of an IC using a two-step nitrogen implant step in accordance with the present invention. FIGS. 5a–5e show cross-sections of a substrate during various steps in manufacturing an IC using two oxidation enhancement implantation steps. It should be noted that not all process steps are shown in these figures. Only general representations of the wafer cross-section at key points in the process are shown. It should also be noted that the horizontal positioning of different oxide layers, as illustrated in FIGS. 3a–3d, may be interchanged depending upon the application. For example, FIGS. 3a–3d depict oxide region 55 to the right of oxide region 47 while FIG. 1 illustrates oxide region 55 positioned between oxide regions 27 and 47.

3a. One Step Oxide Formation Process Using Same Implant of Nitrogen for Low Voltage Gate Oxide and Tunnel Oxide Growth In FIG. 3a, a crystalline silicon substrate 60 having a predetermined light concentration of p-type impurities (P−) is illustrated. Substrate 60 includes a predefined heavily doped programming junction region ("PRJ" region) 65.

Before creating PRJ 65, a sacrificial oxide layer 62 is grown on substrate 60. It should be understood that for convenience, the oxide layer formation in the following figures is depicted as growing only upwardly from the oxidized surface. In actuality, the oxide layer grows bidirectionally above and below the initial surface. Sacrificial oxide ("SACOX") layer 62 typically has a thickness in the range of approximately 100 Å–200 Å. The SACOX layer 62 is generally provided by heating the substrate in a dry oxygen atmosphere at a temperature in the range of approximately 800° C.–1000° C. (900° C., typically), for a given period of time which depends upon the thickness of the SACOX layer desired. In one embodiment, the SACOX layer 62 has a thickness of approximately 150 Å.

Figure 3A:
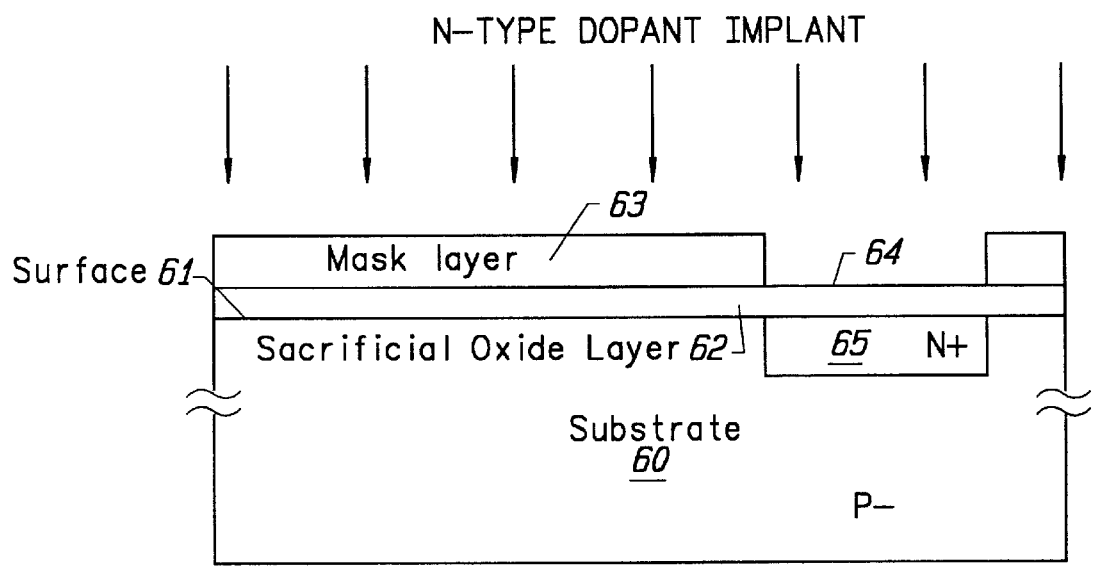
FIGS. 3a–3d illustrate a process for forming multiple oxide thicknesses on and below a silicon wafer substrate surface using a single oxide formation step according to the present invention.

FIG. 3a also illustrates a photoresist mask layer 63 formed onto a surface 64 of the SACOX layer 62 after layer 62 is grown. A conventional photoresist mask may be utilized.

Figure 3B:
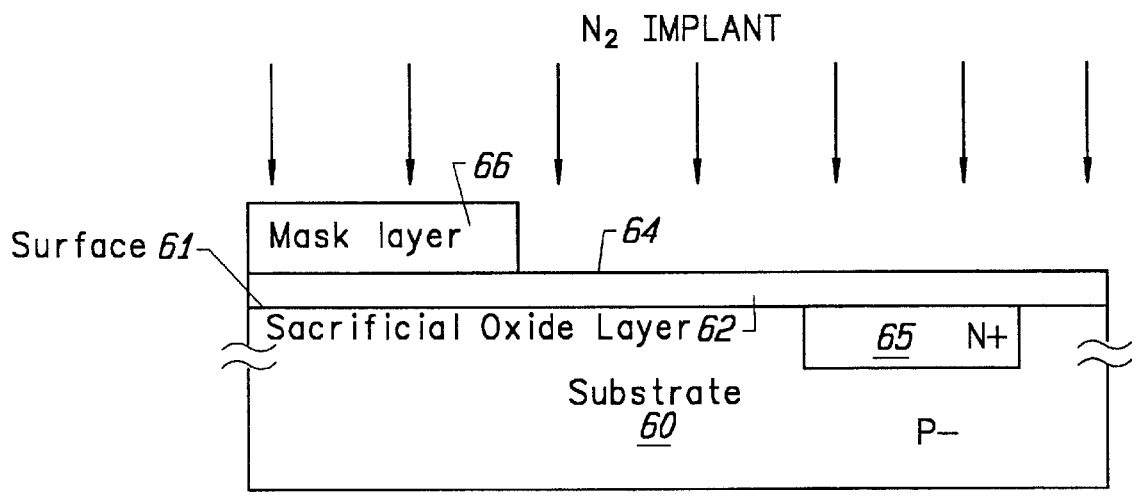

An n-type dopant is implanted through an opening in mask 63 to create PRJ region 65. Thereafter, the silicon wafer substrate 60 undergoes an anneal step at a temperature of approximately 900° C. which diffuses the implanted n-type dopant. The annealing of the n-type dopant forms a highly doped n-type programming junction PRJ 65 in the silicon wafer substrate 60. Referring to FIG. 3b, the photoresist mask layer 63 is removed from the surface 64 of the SACOX layer 63 and a new layer 66 is formed on the surface 64. The photoresist mask layer 66 defines the regions of the silicon wafer substrate 60 that will not receive a nitrogen implant. In one embodiment, the nitrogen implant step is performed with implant concentration of about 15 atoms× $10^{14}/cm^2$ and an ion implantation energy in a range of approximately 29 to 32 KeV (typically, 30 KeV) through SACOX layer 62. Nitrogen implant dosage and energy should be optimized to minimize implant induced damage. The SACOX oxide layer 62 prevents damage to the surface 61 of the silicon wafer substrate 60 during an ion implantation step.

After the nitrogen implantation step, silicon wafer substrate 60 may be annealed to diffuse the implanted nitrogen in silicon wafer substrate 60. In one embodiment, the anneal step on the implanted nitrogen is performed in a rapid thermal annealer at a temperature range of approximately 975° C. for approximately 30 seconds.

Figure 3C:
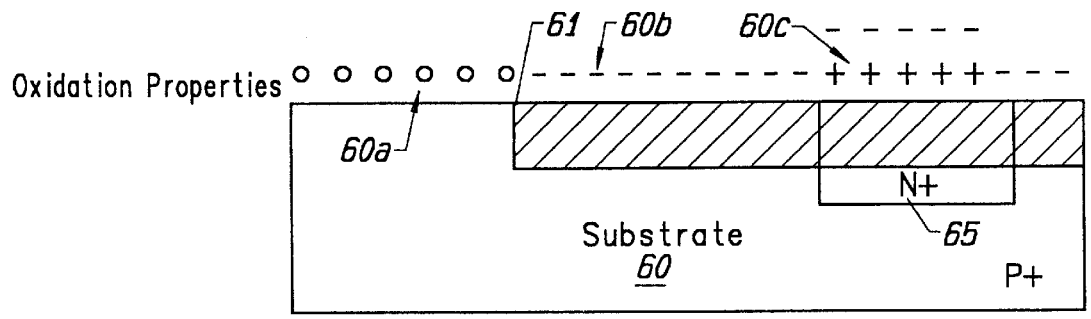

Thereafter, the photoresist mask layer 66 along with the SACOX oxide layer 62 is removed from the surface 61. Referring to FIG. 3c, a nitrogen-rich first region 60b is formed in the silicon wafer substrate 60 due to the ion implantation and nitrogen anneal steps. The implanted nitrogen gives first region 60b oxidation retarding properties. Oxidation retardation properties are denoted by minus signs (− − −). In other words, in a subsequent oxide growth step, the nitrogen-doped region 60b will oxidize more slowly than regions 60a and 60c.

Conversely, heavy doping with an N+ or P+ implant enhances oxidation. Region 60c is shown as (∓ ∓ ∓) because the nitrogen has combined with the N+ or P+. The oxidation retardation properties of nitrogen reduce the otherwise oxidation enhancement properties of the heavily doped N+ or P+ region 60c. Thus, in a subsequent oxide growth step, oxide will form more slowly than otherwise caused by the oxidation enhancement properties of heavy doping with N+ or P+. Region 60a is shown as (O O O) to denote that neither oxidation enhancement, retardation, or a combination thereof is present.

Figure 3D:
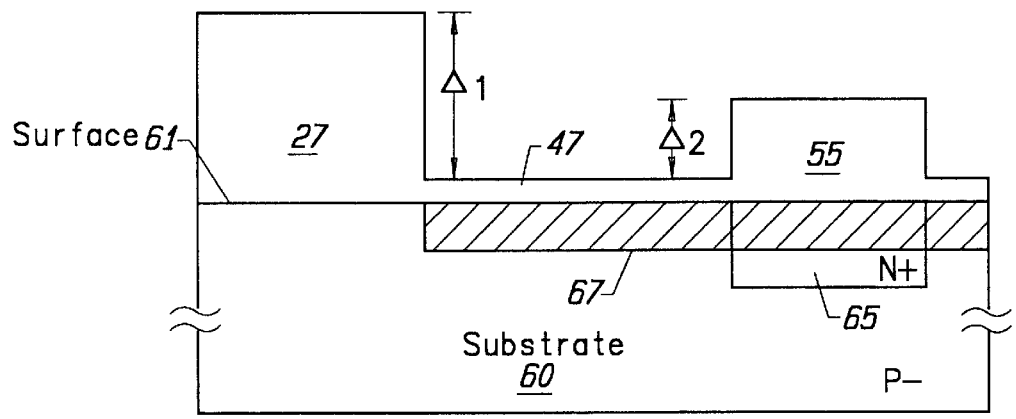

Typically, PRJ 65 is created by using phosphorous, arsenic or a combination thereof. The dosage concentration of PRJ 65 will depend upon the concentration of a subsequent nitrogen implantation step and the targeted difference $\Delta_2$ between oxide region 47 and 55 as illustrated in FIG. 3d. Likewise, the nitrogen concentration will depend upon the targeted difference A between oxide regions 27 and 67.

FIG. 3d illustrates the resulting oxide layer profile after a one-step oxidation of substrate 60 shown in FIG. 3c. The gate oxide portion 27 is thickest, 47 is thinnest and 55 is of intermediate thickness. In an embodiment, the oxide formation step is precisely controlled to form a targeted 150 Å oxide layer on silicon wafer substrate 60. The resulting oxide layer includes a gate oxide region 47 having a thickness of approximately 70 Å due to the retarding effect of the implanted nitrogen in nitrogen region 60b. The resulting oxide layer also includes a tunnel oxide region 55 having a thickness of approximately 90 Å due to the combined effect of the oxide retardation provided by the nitrogen and the oxide enhancement provided by the heavily doped n-type material in PRJ 65.

3b. One Step Oxidation Using Different Concentrations of Nitrogen for Low Voltage Gate Oxide and Tunnel Oxide Growth FIGS. 4a–4d illustrate a process for forming multiple oxide thicknesses on the silicon wafer substrate 50 using two separate nitrogen implantation steps. As in the above process, a substrate 74, PRJ 73 and SACOX oxide layer 71 is formed and illustrated in FIG. 4a.

Figure 4A:
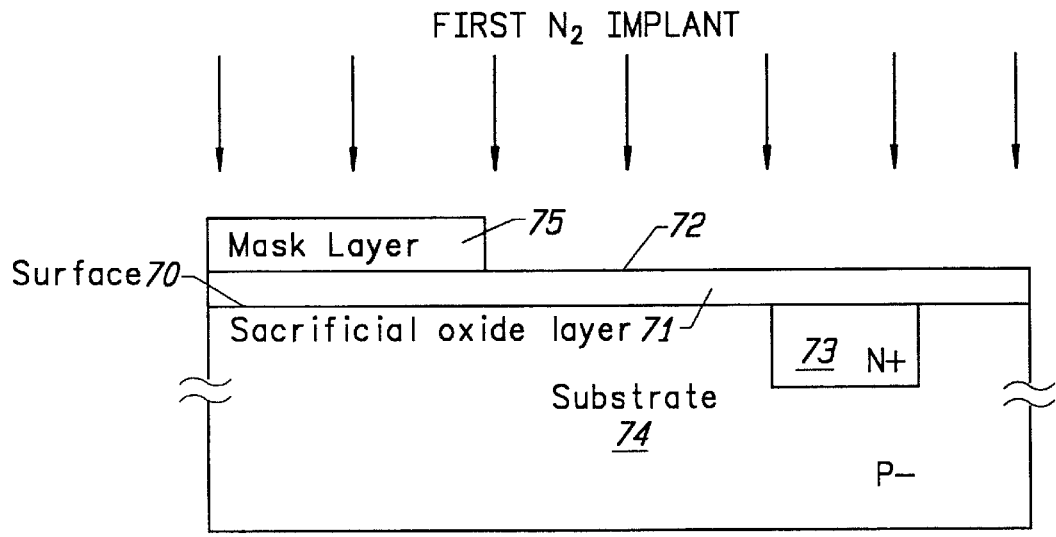
FIGS. 4a–4d illustrate a process for forming multiple oxide thicknesses on and below a silicon wafer substrate surface using two separate nitrogen implantation steps according to the present invention.
Figure 4B:
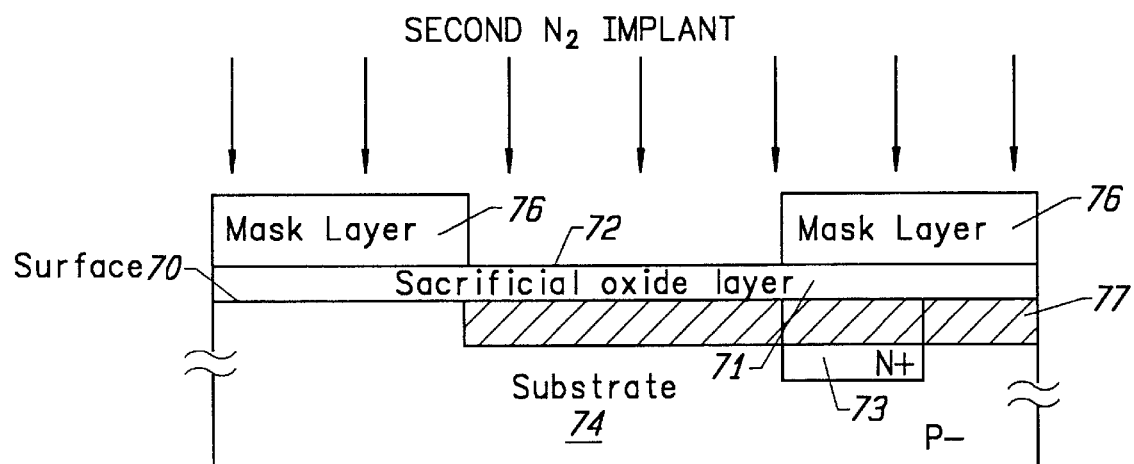

FIG. 4a also illustrates a photoresist mask layer 75 formed onto a surface 72 of SACOX oxide layer 71. The photoresist mask layer 75 defines the regions of silicon wafer substrate 74 that receives a first nitrogen implant. The first nitrogen implant is provided with a nitrogen concentration dopant and energy level for providing the targeted oxide layer thicknesses. The photoresist mask layer 75 is then removed after a formation of a first nitrogen implant region 77. Thereafter, a photoresist mask layer 76 is formed onto the surface 72 as shown in FIG. 4b. The photoresist mask layer 76 forms an opening to the surface 72 that defines regions of the silicon wafer substrate 74 that receive a second nitrogen implant.

Figure 4C:
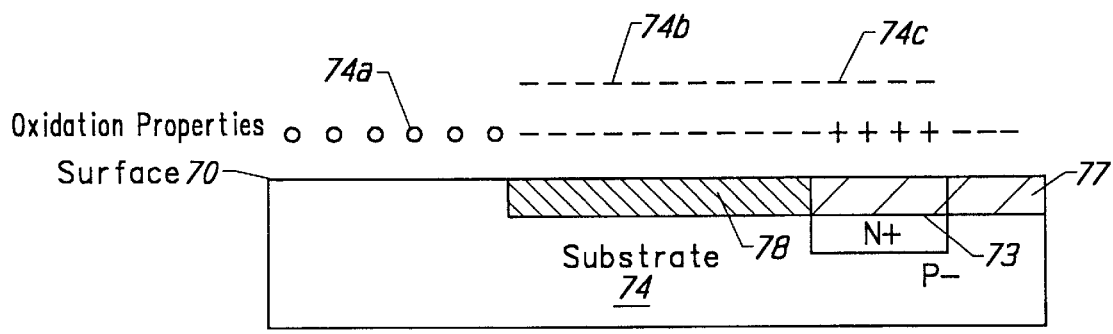

After the first and second nitrogen implantation steps, the photoresist mask layer 76 is removed from the surface 70 as shown in FIG. 4c. The silicon wafer substrate 74 may be annealed to diffuse the implanted nitrogen. In an embodiment, a rapid thermal annealer is used. Thereafter, the SACOX oxide layer 71 is removed from surface 70.

FIG. 4c illustrates a low dose nitrogen region 77 and a high dose nitrogen region 78 formed in the silicon wafer substrate 74 by the first and second ion implantation steps and the subsequent annealing step. The nitrogen dosage in the high dose nitrogen region 78 results from the combination of the first and second nitrogen implantation steps. As discussed above, region 74a depicts a region (O O O) with neither oxidation enhancement nor retardation properties. Region 74b depicts a region (= = =) with oxidation retardation properties. Finally, region 74c illustrates a region ($\mp$ $\mp$ $\mp$) with a combination of oxidation enhancement and retardation properties.

Figure 4D:
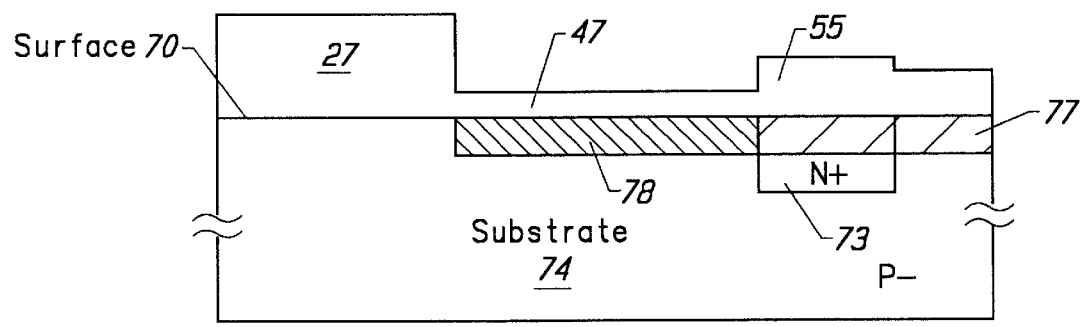

FIG. 4d illustrates the resulting oxide layer profile after a one-step oxide formation step on the silicon wafer substrate 74 which includes the low dose nitrogen region 77, high dose nitrogen region 78 and PRJ 73. The resulting oxide layer includes a gate oxide layer region 27, as illustrated in FIGS. 1a and 1b, having a thickness of approximately 150 Å for an oxide formation step that is targeted to form a 150 Å oxide layer on the silicon wafer substrate 74. The resulting oxide layer includes a gate oxide region 47, as illustrated in FIGS. 1a and 1d, having a thickness of approximately 70 Å due to the retarding effect of the implanted nitrogen in the high dose nitrogen region 78. The resulting oxide layer also includes an oxide region 55, as illustrated in FIGS. 1a and e, having a thickness of approximately 90 Å due to the combined effect of the oxide retardation provided by the low dose nitrogen region 77 and the oxide enhancement provided by the heavily doped n-type material in PRJ 73.

As described above with regard to the method in section 3a, oxide layer thicknesses in oxide regions 27, 47 and 55 can be adjusted or controlled. Specifically, oxide thickness is controlled using nitrogen dopant concentrations and energy levels in the two nitrogen implant steps, as well as oxidation enhancement concentrations and energy levels used in creating PRJ 73.

3c. Two Step Oxide Formation Process Using Nitrogen Concentration to Reduce Low Voltage Oxide Growth and PRJ Concentrations to Enhance Tunnel Oxide Growth FIGS. 5a–5e illustrate a process for forming multiple oxide thicknesses on and below a silicon wafer substrate 90 using two oxide formation steps. Similar to the processes described above, a PRJ 94 is formed in substrate 90. A first oxide layer 91 is grown onto a surface 92 of the silicon wafer substrate 90 as shown in FIG. 6a. In an embodiment, the first oxide layer 91 has a thickness $T_1$ of approximately 125 Å.

Figure 5A:
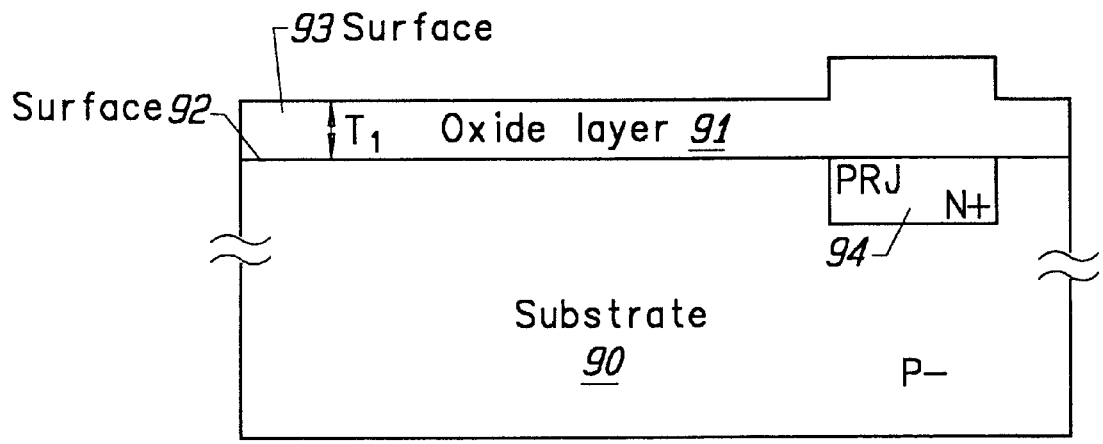
FIGS. 5a–5e illustrate a process for forming multiple oxide thicknesses on and below a silicon wafer substrate surface using two oxide formation steps according to the present invention.
Figure 5B:
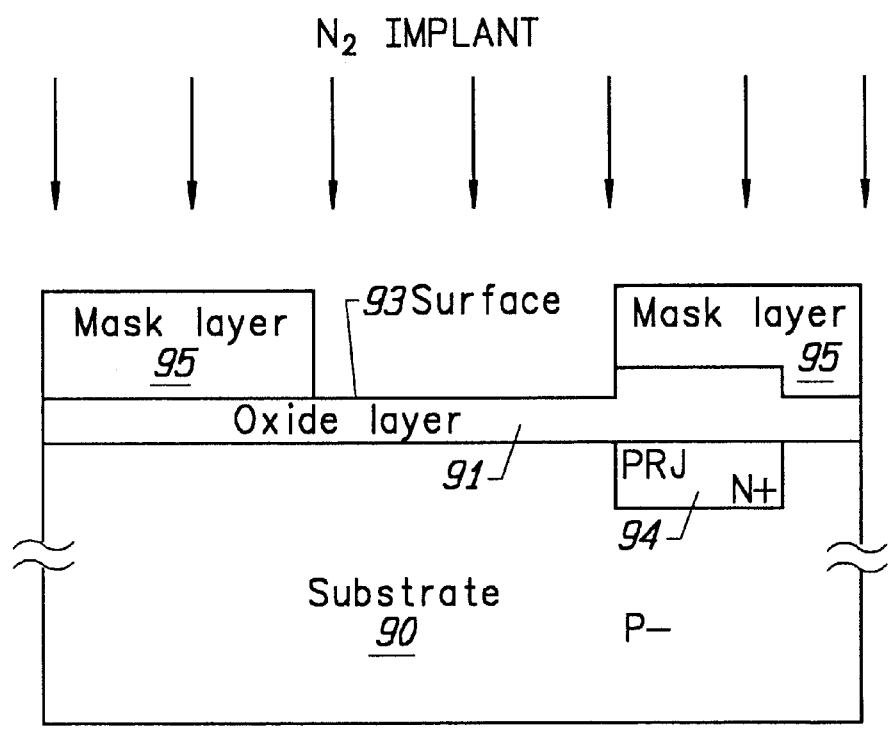

FIG. 5b illustrates a nitrogen implant step after a photoresist mask layer 95 has been formed onto a surface 93 of the first oxide layer 91. The photoresist mask layer 95 forms an opening to the surface 93 and defines regions of the silicon wafer substrate 90 that receive the nitrogen implant. After a nitrogen implantation step, a photoresist mask layer 95 is removed and then the silicon wafer substrate 90 is annealed to diffuse the implanted nitrogen. In an embodiment, an annealer is used. If an annealing step is used, a nitrogen dosage 1 atom$\times 10^5$/cm$^2$ concentration is typically used. However, because an annealing step tends to damage the surface and quality of the wafer, a smaller dosage concentration of approximately 1 atom$\times 10^{14}$/cm$^3$ nitrogen may be used without annealing an annealing step.

Figure 5C:
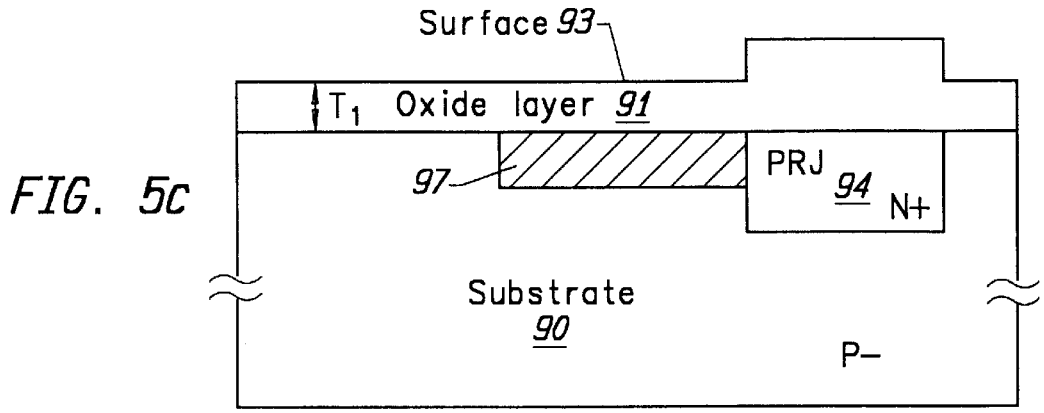
Figure 5D:
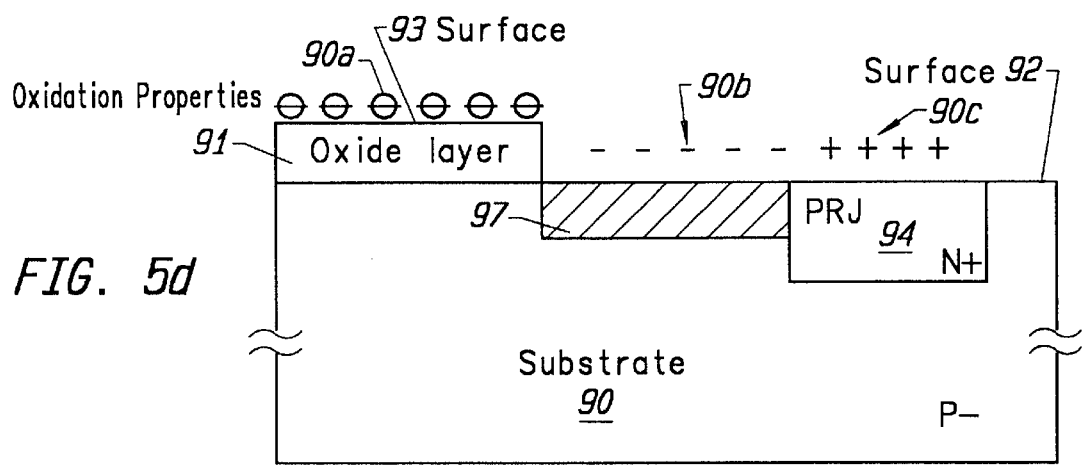
Figure 5E:
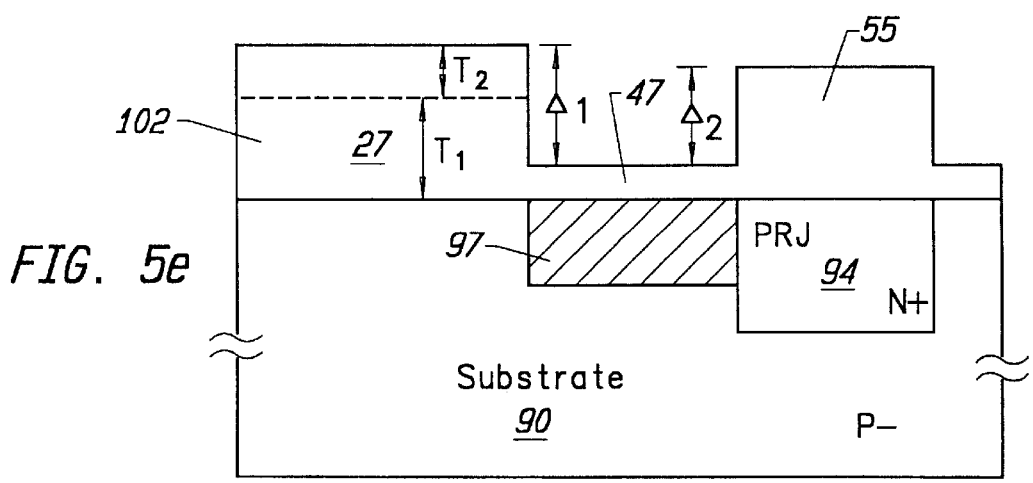

FIG. 5c illustrates a nitrogen region 97 formed in the silicon wafer substrate 90 by the nitrogen implantation and subsequent anneal steps. A photoresist mask layer is then deposited onto the surface 93 to define oxide layer 91 thickness $T_1$ (typically, 125 Å) of the desired resulting oxide layer thickness ($T_1+T_2$). The remainder of the first oxide layer 91 is etched away from the surface 92 as shown in FIG. 5d. Thereafter, the photoresist on the surface 93 is removed and a second oxide formation step is performed, as illustrated in FIG. 5e. In this embodiment, the second oxide layer is targeted for a thickness of approximately 80 Å on an area of the surface 92 not having nitrogen implants or programming junction implants. The second oxide layer formation step results in an oxide thickness of $T_2$ in oxide region 27. Region 90a, shown as ($\ominus$ $\ominus$ $\ominus$), illustrates an area in substrate 90 where oxidation is retarded due to the existing oxide layer 91. Regions 90b and 90c, shown as (– – –) and (+ + +), illustrate areas in substrate 90 which have oxide retarding and enhancement properties, respectively.

FIG. 5e illustrates the resulting oxide layer profile after the second oxide formation step on the silicon wafer substrate 90. The resulting oxide includes a gate oxide region 27, as illustrated in FIG. 1, having a thickness of approximately 150 Å resulting from the interaction of the first and second oxide formation steps. The 125 Å and 80 Å oxidation steps combine to form a 150 Å gate oxide region 27 due to the hindering effects on oxidation provided by the first oxide layer 91. The resulting oxide layer includes a gate oxide region 47, as illustrated in FIG. 1, having a thickness of approximately 70 Å due to the retarding effect of the implanted nitrogen in the nitrogen region 97. The resulting oxide layer also includes an oxide region 55 having a thickness of approximately 90 Å due to the oxide enhancement provided by the heavily doped n-type material in PRJ 94.

As in the other processes discussed above, oxide layer thickness in oxide regions 27, 47 and 55 (or oxide layer thickness differences $\Delta_1$ and $\Delta_2$) can be adjusted or controlled, depending on 1) nitrogen concentrations, 2) oxidation enhancement concentrations, 3) annealing temperatures (if an annealing step is used), and 4) annealing temperatures (if an annealing step is used).

4. Nitrogen and Oxidation Enhancement Material Affect on Oxidation Formation

Figure 6:
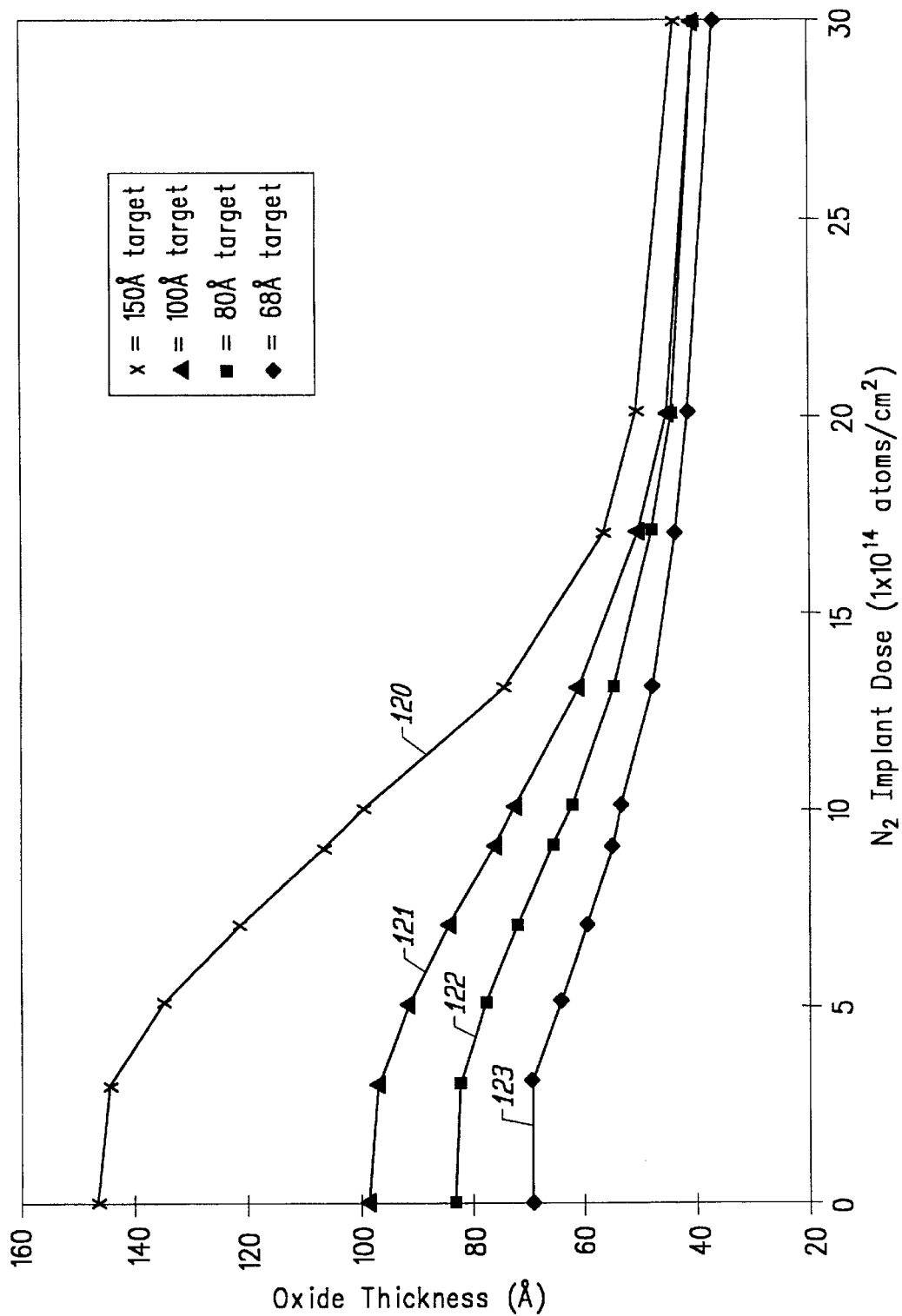
FIG. 6 is a graph illustrating the relationship between oxide formation thickness on and below a silicon wafer substrate surface and implanted nitrogen concentrations in the silicon wafer substrate according to the present invention.
Figure 7:
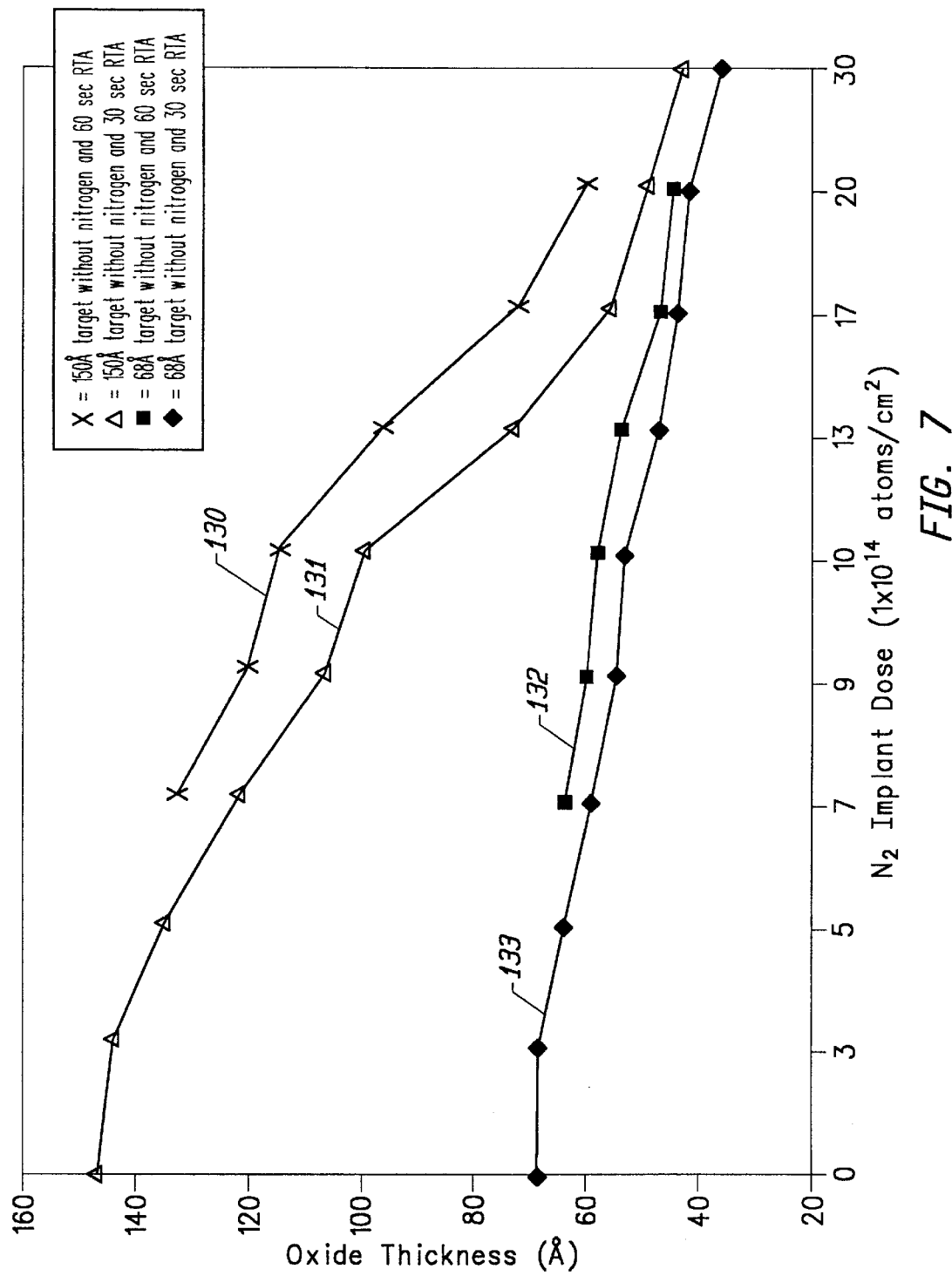
FIG. 7 is a graph illustrating the relationship between oxide thickness on and below a silicon wafer substrate surface using different nitrogen implantation concentrations and different RTA times according to the present invention.

Graphs in FIGS. 6 through 9 illustrate how oxide thickness in oxide regions 27, 47 and 55 can be adjusted or controlled, depending on 1) nitrogen concentration (FIG. 6), 2) oxidation enhancement concentration (FIGS. 8–9), 3) annealing temperatures, and 4) annealing times (FIG. 7). These parameters may be controlled to obtain different oxide thicknesses for various circuit elements shown in Table 1. For example, the difference $\Delta_1$ in oxide thicknesses between gate oxide region 27 and gate oxide region 47 may be controlled by the amount of nitrogen implanted.

FIG. 6 illustrates the resulting thickness of oxide growth on a silicon wafer substrate in relation to implanted nitrogen concentrations. A set of curves 120–123 indicate the resulting oxide thickness versus nitrogen implant dosage for a set of example target oxide thicknesses after a rapid thermal annealing time of 30 seconds. The curve 120 corresponds to an oxide formation recipe that targets an oxide thickness target of 150 Å without a nitrogen implant in silicon wafer substrate. The curve 121 corresponds to a 100 Å oxide target thickness without a nitrogen implant in a silicon wafer substrate. Similarly, the curves 122 and 123 represent 80 Å and 68 Å target oxide thicknesses, respectively, without nitrogen implanted in a silicon wafer substrate.

Each curve 120–123 demonstrates the oxide retarding effect of nitrogen, for example nitrogen implant region 60b in FIG. 3, as the nitrogen implant concentrations increase. The curves 120–123 enable the selection of implant dosages that will result in the desired oxide thicknesses in the oxide layers 27, 47 and 55 of the resulting oxide layer formed on surface 61 of substrate 60. Each of the curves 120–123 correspond to a nitrogen diffusion step performed in a rapid thermal annealer for 30 seconds.

FIG. 7 illustrates the relationship between resulting oxide thickness and nitrogen implantation dosage for differing RTA times at 975 degrees C. A curve 130 corresponds to a 150 Å oxide target thickness without nitrogen implantation and a 60 second RTA time. A curve 131 corresponds to a 150 Å oxide target thickness without nitrogen implantation and a 30 second RTA time. A pair of curves 132 and 133 correspond to a 68 Å oxide target thickness without nitrogen implantation having 60 second and 30 second RTA times, respectively As can be seen, longer RTA times result in less retardation of oxide formation.

Figure 8:
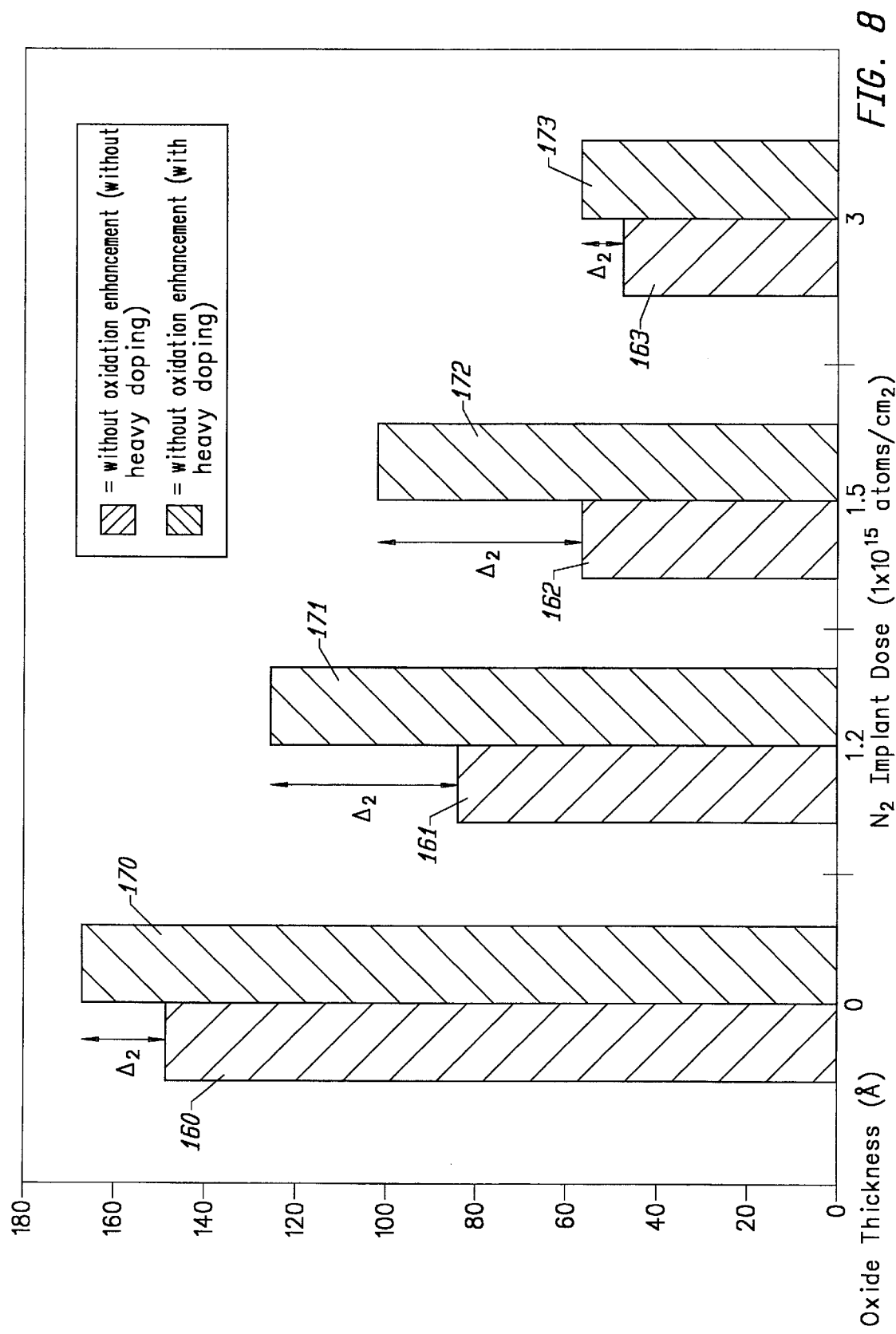
FIG. 8 is a graph illustrating different oxide thickness on and below a silicon wafer substrate surface using different nitrogen implantation concentrations and oxidation enhancement concentrations according to the present invention; and, FIG. 9 is a graph illustrating a relationship between different oxide formation rates and various nitrogen implantation dosages programming junction dosages according to the present invention.

FIG. 8 illustrates the relationship between resulting oxide thickness and nitrogen implantation dosage with and without the oxide enhancement effects provided by the heavy doping of the programming junction, for example PRJ 65 in FIG. 3, for four different nitrogen implant dosage levels in the programming junction. The bars 160–163 indicate oxide thickness results without dopant in the programming junction. The bars 170–173 show oxide thickness results with doping in the programming junction. The difference between the bars, as illustrated by $\Delta_2$ as shown in FIG. 3d.

Figure 9:
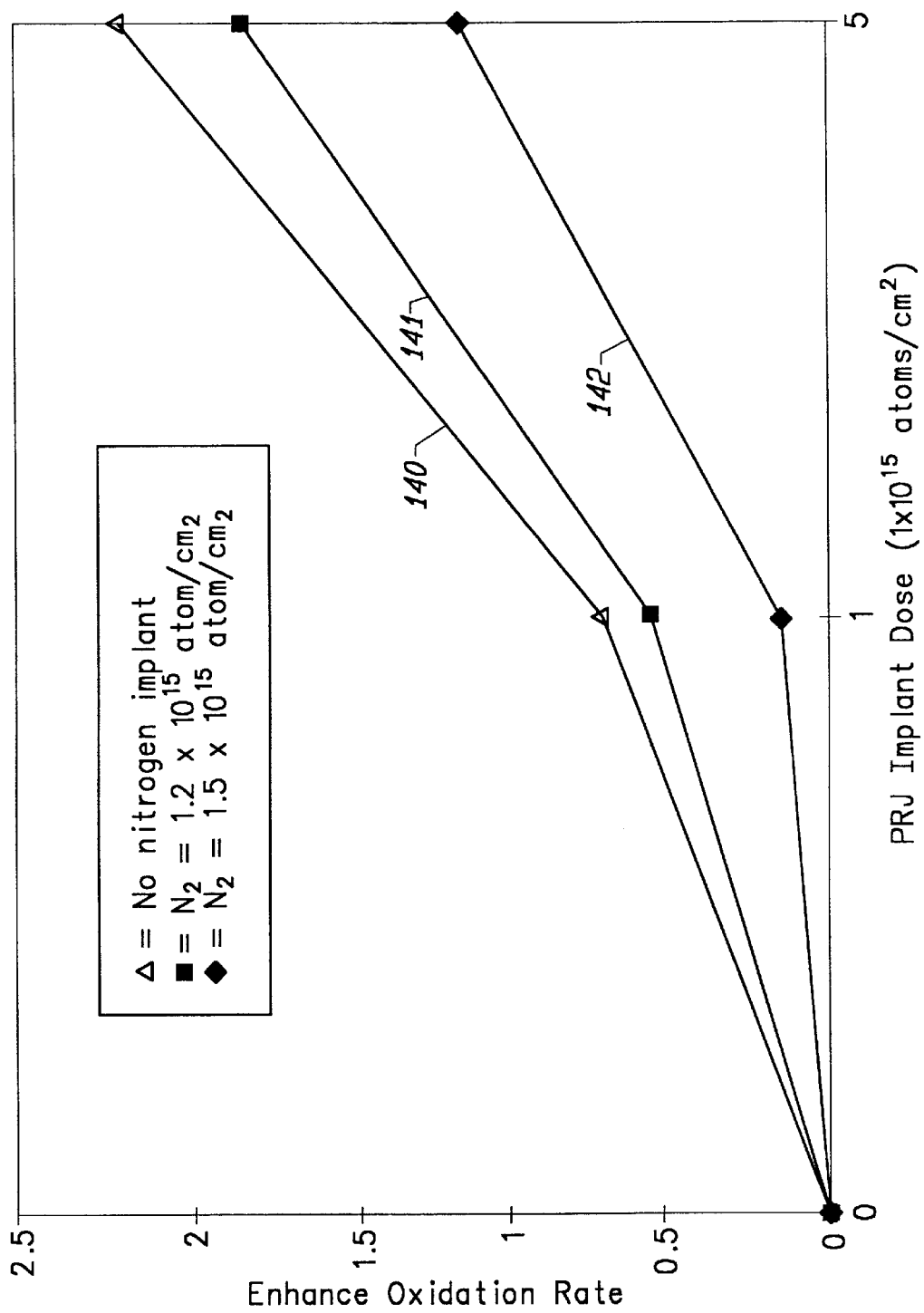

FIG. 9 illustrates the effect of nitrogen implantation into a programming junction. A set of curves 140–142 show the effect of nitrogen concentrations on the enhanced oxidation caused by the doping concentrations in a programming junction. The curve 140 illustrates the effects on resulting oxide thickness when no nitrogen is implanted into a silicon wafer substrate. The curve 141 shows resulting oxide thickness for a nitrogen dosage of approximately $1.2 \times 10^{15}$ atoms/cm$^2$ in a programming junction with varying oxidation enhancement concentration doses. The curve 142 shows resulting oxide thickness for a nitrogen dosage of approximately $1.5 \times 10^{15}$ atoms/cm$^2$ with varying oxidation enhancement concentration doses.

The foregoing descriptions of various embodiments of the present invention has been provided for the purposes of illustration and description. It is not intended to be exhaustive or to limit the invention to the precise forms disclosed. Many modifications and variations will be apparent to practitioners skilled in the art after reading the above. One of ordinary skill in the art of manufacturing semiconductor devices would understand that this particular set of process steps have been offered for illustration and various modifications in temperatures and thicknesses may be used depending upon the particular application intended. The embodiments were chosen and described in order to explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit comprising:

(a) a substrate;

(b) an oxide layer where the oxide layer includes a first oxide thickness, a second oxide thickness different from the first by ($\Delta_1$) and a third oxide thickness different from the second by ($\Delta_2$), wherein the first oxide thickness is an approximately 150 Å gate oxide layer, the second oxide thickness is an approximately 80 Å gate oxide layer and, the third oxide thicknesses is an approximately 90 Å tunnel oxide layer.

2. An integrated circuit comprising:

(a) a substrate;

(b) an oxide layer where the oxide layer includes a first oxide thickness, a second oxide thickness different from the first by ($\Delta_1$) and a third oxide thickness different from the second by ($\Delta_2$), wherein the first oxide thickness is an approximately 150 Å gate oxide layer, the second oxide thickness is an approximately 70 Å gate oxide layer and, the third oxide thickness is an approximately 90 Å tunnel oxide layer.

3. An integrated circuit comprising:

(a) a substrate;

(b) an oxide layer where the oxide layer includes a first oxide thickness, a second oxide thickness different from the first by ($\Delta_1$) and a third oxide thickness different from the second by ($\Delta_2$), wherein the first oxide thickness is an approximately 150 Å gate oxide layer, the second oxide thickness is an approximately 50 Å gate oxide layer and, the third oxide thickness is an approximately 90 Å tunnel oxide layer.

4. A non-volatile memory cell on a silicon wafer substrate, comprising:

(a) a first transistor having a drain, source, channel and control gate, the control gate being separated from the channel by a gate oxide layer having a first oxide thickness;

(b) a second transistor having a drain, source, channel and control gate, the control gate being separated from the channel by a gate oxide layer having a second oxide thickness; and, (c) a tunnel capacitor having a tunnel oxide layer having a third oxide thickness, wherein the first oxide thickness is an approximately 150 Å gate oxide layer, the second oxide thickness is an approximately 80 Å gate oxide layer and, the third oxide thickness is an approximately 90 Å tunnel oxide layer.

5. A non-volatile memory cell on a silicon wafer substrate, comprising:

(a) a first transistor having a drain, source, channel and control gate, the control gate being separated from the channel by a gate oxide layer having a first oxide thickness;

(b) a second transistor having a drain, source, channel and control gate, the control gate being separated from the channel by a gate oxide layer having a second oxide thickness; and, (c) a tunnel capacitor having a tunnel oxide layer having a third oxide thickness, wherein the first oxide thickness is an approximately 150 Å gate oxide layer, the second oxide thickness is an approximately 70 Å gate oxide layer and, the third oxide thickness is an approximately 90 Å tunnel oxide layer.

6. A non-volatile memory cell on a silicon wafer substrate, comprising:
   (a) a first transistor having a drain, source, channel and control gate, the control gate being separated from the channel by a gate oxide layer having a first oxide thickness;
   b) a second transistor having a drain, source, channel and control gate, the control gate being separated from the channel by a gate oxide layer having a second oxide thickness; and,
   (c) a tunnel capacitor having a tunnel oxide layer having a third oxide thickness, wherein the first oxide thickness is an approximately 150 Å gate oxide layer, the second oxide thickness is an approximately 50 Å gate oxide layer and, the third oxide thickness is an approximately 90 Å tunnel oxide layer.

* * * * *